US012622085B2

(12) United States Patent
Fukunaka et al.

(10) Patent No.: US 12,622,085 B2
(45) Date of Patent: May 5, 2026

(54) GAS SENSOR

(71) Applicant: Asahi Kasei Microdevices Corporation, Tokyo (JP)

(72) Inventors: Toshiaki Fukunaka, Tokyo (JP); Takaaki Furuya, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 469 days.

(21) Appl. No.: 18/180,846

(22) Filed: Mar. 9, 2023

(65) Prior Publication Data

US 2023/0299224 A1      Sep. 21, 2023

(30) Foreign Application Priority Data

Mar. 18, 2022    (JP) ................................. 2022-044703
Mar. 1, 2023    (JP) ................................. 2023-031414

(51) Int. Cl.
| *G01N 21/3504* | (2014.01) |
| *G01N 21/25* | (2006.01) |
| *H01L 23/00* | (2006.01) |
| *H10F 55/10* | (2025.01) |
(Continued)

(52) U.S. Cl.
CPC ......... *H10F 55/255* (2025.01); *G01N 21/255* (2013.01); *G01N 21/3504* (2013.01); *H01L 24/16* (2013.01); *H01L 24/29* (2013.01); *H10F 55/17* (2025.01); *H10F 77/331* (2025.01);
(Continued)

(58) Field of Classification Search
CPC ...... H10F 55/255; H10F 55/17; H10F 77/331; G01N 21/3504; G01N 21/255; H01L 2924/15311
See application file for complete search history.

(56) References Cited

U.S. PATENT DOCUMENTS

| 11,747,272 B2 * | 9/2023 | Deliwala ............ G01N 33/0022 |
| | | 356/51 |
| 2005/0087747 A1 | 4/2005 | Yamada et al. |
(Continued)

FOREIGN PATENT DOCUMENTS

| CN | 1591920 A | 3/2005 |
| CN | 108735852 A | 11/2018 |
(Continued)

*Primary Examiner* — David Vu
*Assistant Examiner* — Brandon C Fox
(74) *Attorney, Agent, or Firm* — KENJA IP LAW PC

(57) ABSTRACT

Provided is a gas sensor that can suppress characteristic variation caused by deformation of a semiconductor substrate. The gas sensor (1) includes a substrate (redistribution layer 30), a light-emitting element (11) provided at a front surface (30*a*) or embedded in the substrate, a light-receiving element (12) that is provided at the front surface or embedded in the substrate and that receives light emitted from the light-emitting element, and a plurality of external connection terminals (40) at a rear surface (30*b*) that is an opposite surface to the front surface of the substrate. At least a portion of the plurality of external connection terminals is electrically connected to the light-emitting element and the light-receiving element. The plurality of external connection terminals is arranged such that, in plan view, the light-emitting element and the light-receiving element are not present on a line linking any two external connection terminals.

10 Claims, 8 Drawing Sheets

(51) Int. Cl.
    *H10F 55/255*      (2025.01)
    *H10F 77/30*      (2025.01)

(52) U.S. Cl.
    CPC ................ *G01N 2021/3509* (2013.01); *H01L 2924/15311* (2013.01)

(56) References Cited

U.S. PATENT DOCUMENTS

| | | | |
|---|---|---|---|
| 2011/0108747 A1* | 5/2011 | Liu | ....................... H01L 25/167 |
| | | | 250/551 |
| 2015/0147022 A1 | 5/2015 | Matsuda | |
| 2017/0052277 A1 | 2/2017 | Wong et al. | |
| 2018/0082990 A1* | 3/2018 | Furuyama | ............. H10F 77/933 |
| 2018/0306638 A1 | 10/2018 | Ishikawa | |
| 2018/0348121 A1 | 12/2018 | Deliwala | |

| | | | |
|---|---|---|---|
| 2020/0103339 A1* | 4/2020 | Castagna | ........... G01N 21/3504 |
| 2022/0352133 A1* | 11/2022 | Luan | ....................... H01L 24/48 |
| 2024/0204136 A1* | 6/2024 | Fukunaka | ......... H01L 23/49816 |

FOREIGN PATENT DOCUMENTS

| | | | |
|---|---|---|---|
| JP | 2005079385 A | 3/2005 | |
| JP | 2006005141 A | 1/2006 | |
| JP | 2007503586 A | 2/2007 | |
| JP | 2012220352 A | 11/2012 | |
| JP | 2013185996 A | 9/2013 | |
| JP | 2015125101 A | 7/2015 | |
| JP | 2017183632 A | 10/2017 | |
| JP | 2020046416 A | 3/2020 | |
| JP | 2020129656 A | 8/2020 | |
| JP | 2021143918 A | 9/2021 | |
| WO | 2013179522 A1 | 12/2013 | |
| WO | 2018222764 A1 | 12/2018 | |

* cited by examiner

GAS SENSOR

CROSS-REFERENCE TO RELATED APPLICATIONS

The present application claims priority of Japanese Patent Application No. 2022-044703 (filed Mar. 18, 2022) and Japanese Patent Application No. 2023-031414 (filed Mar. 1, 2023), the entire contents of which are incorporated herein by reference.

TECHNICAL FIELD

The present disclosure relates to a gas sensor.

BACKGROUND

An infrared light-receiving element (infrared sensor) that outputs a signal in accordance with received infrared light and an infrared light-emitting element (infrared light-emitting diode (LED)) that emits infrared light in response to input electrical power are known semiconductor elements. A quantum infrared light-receiving element detects infrared light through photoelectric current generated when a semiconductor having a pn junction or pin junction absorbs infrared light. An infrared light-emitting element emits infrared light through voltage applied in a forward direction. Infrared light-receiving elements and infrared light-emitting elements may be used in non-dispersive infrared (NDIR) gas sensors, for example. An NDIR gas sensor can measure gas concentration using an infrared light-receiving element that receives infrared light of an absorption wavelength band in accordance with a detection target gas and an infrared light-emitting element that emits infrared light of this absorption wavelength band. For example, Patent Literature (PTL) 1 discloses a small NDIR gas sensor that is covered by a cap having a mirror provided in an inner part and that has constituent components arranged on a substrate.

CITATION LIST

Patent Literature

PTL 1: WO 2018/222764 A1

SUMMARY

In a device having a configuration in which a semiconductor element is arranged on a substrate, a semiconductor substrate may also be subjected to stress. For example, warping of the semiconductor substrate may occur under the influence of thermal expansion during device mounting or the like. In a case in which the device is a gas sensor, this warping may cause characteristic variation of the gas sensor. Particularly with regard to small gas sensors, deformation of a semiconductor substrate has a significant effect on characteristics, and thus there is demand for a technique that can suppress the effect on semiconductor elements.

In view of the situation set forth above, an object of the present disclosure is to provide a gas sensor that can suppress characteristic variation caused by deformation of a semiconductor substrate.

(1) A gas sensor according to an embodiment of the present disclosure comprises:

a substrate;

a light-emitting element provided at a front surface that is one surface of the substrate or embedded in the substrate;

a light-receiving element that is provided at the front surface of the substrate or embedded in the substrate and that receives light emitted from the light-emitting element; and a plurality of external connection terminals at a rear surface that is an opposite surface to the front surface of the substrate, with at least a portion of the plurality of external connection terminals electrically connected to the light-emitting element and the light-receiving element, wherein the plurality of external connection terminals is arranged such that, in plan view, the light-emitting element and the light-receiving element are not present on a line linking any two external connection terminals.

(2) As an embodiment of the present disclosure, in the foregoing (1), the plurality of external connection terminals is arranged in a region that is in one direction relative to each of the light-emitting element and the light-receiving element in plan view.

(3) As an embodiment of the present disclosure, in the foregoing (1) or (2), the light-emitting element and the light-receiving element are partially covered by a seal.

(4) As an embodiment of the present disclosure, in any one of the foregoing (1) to (3), the substrate includes a redistribution layer formed at an electrode formation surface side of the light-emitting element and the light-receiving element, and the light-emitting element and the light-receiving element are electrically connected to at least a portion of the plurality of external connection terminals via the redistribution layer.

(5) As an embodiment of the present disclosure, in any one of the foregoing (1) to (4), the gas sensor further comprises a light guide that guides light emitted from the light-emitting element to the light-receiving element, wherein the light guide is adhered to the substrate at an adhesion surface of the front surface of the substrate, and the adhesion surface is provided such that, in plan view, the light-emitting element and the light-receiving element are not present on a line linking any two points in the adhesion surface.

(6) As an embodiment of the present disclosure, in the foregoing (5), the adhesion surface is included in a region of the front surface that corresponds to a region where the plurality of external connection terminals is arranged at the rear surface.

(7) As an embodiment of the present disclosure, in any one of the foregoing (1) to (6), the gas sensor further comprises an optical filter provided at an emission surface of the light-emitting element or a reception surface of the light-receiving element.

(8) As an embodiment of the present disclosure, in any one of the foregoing (1) to (7), the plurality of external connection terminals is an LGA or a BGA.

(9) As an embodiment of the present disclosure, in any one of the foregoing (1) to (8), the light-emitting element and the light-receiving element are embedded in the substrate, and a surface opposite to an electrode formation surface of the light-emitting element and the light-receiving element is exposed from the substrate.

According to the present disclosure, it is possible to provide a gas sensor that can suppress characteristic variation caused by deformation of a semiconductor substrate.

BRIEF DESCRIPTION OF THE DRAWINGS

In the accompanying drawings:

FIG. 5 is a cross-sectional view illustrating a partially enlarged cross-section including a photoelectric conversion element of the gas sensor illustrated in FIG. 1;

DETAILED DESCRIPTION

Figure 1:
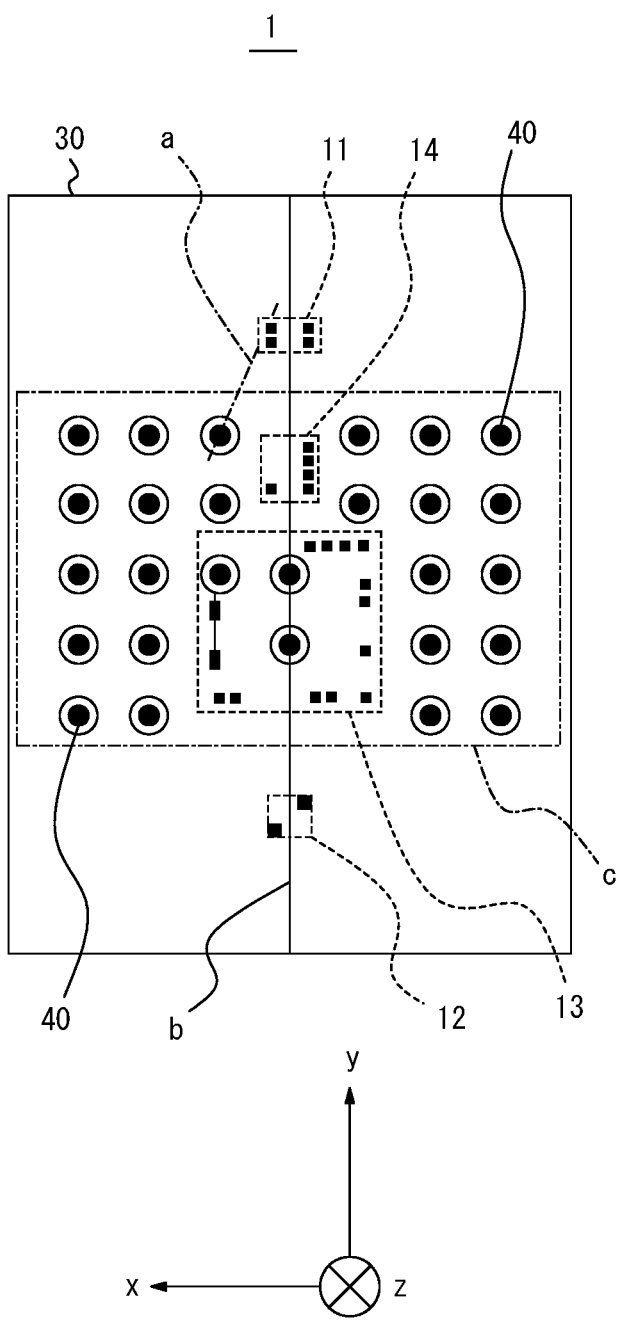
FIG. 1 is a schematic diagram illustrating a configuration example of a gas sensor according to an embodiment of the present disclosure.

The following describes a gas sensor according to an embodiment of the present disclosure with reference to the drawings. Parts in the drawings that are the same or correspond are allotted the same reference signs. In description of the present embodiment, descriptions of parts that are the same or correspond may be omitted or abbreviated as appropriate.

Figure 2:
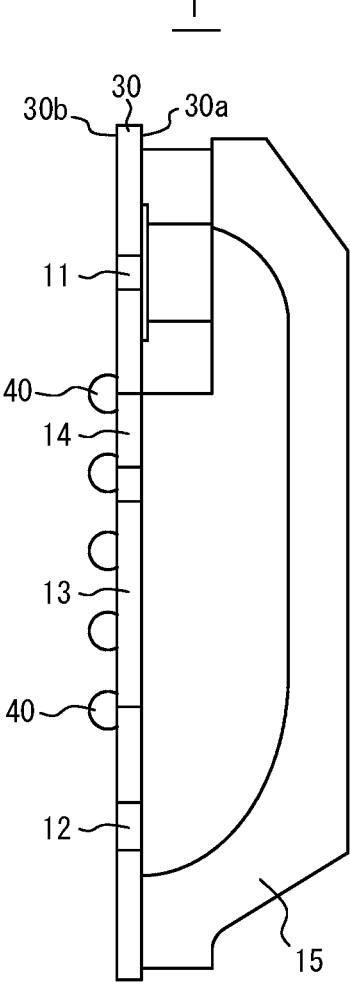
FIG. 2 is a cross-sectional view illustrating a cross-section of the gas sensor illustrated in FIG. 1.
Figure 2:
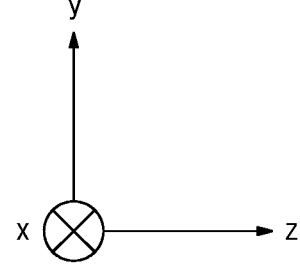
Figure 3:
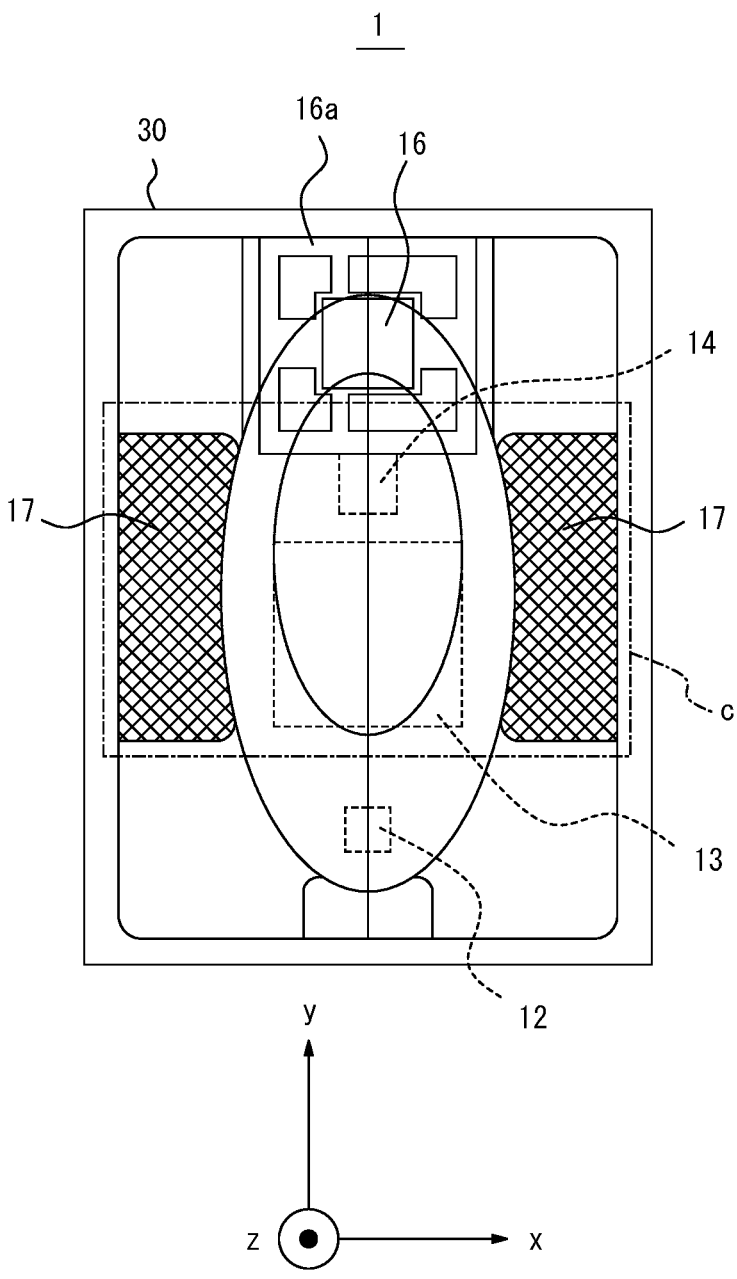
FIG. 3 is a plan view illustrating an upper surface of the gas sensor illustrated in FIG. 1 with a light guide removed.
Figure 4:
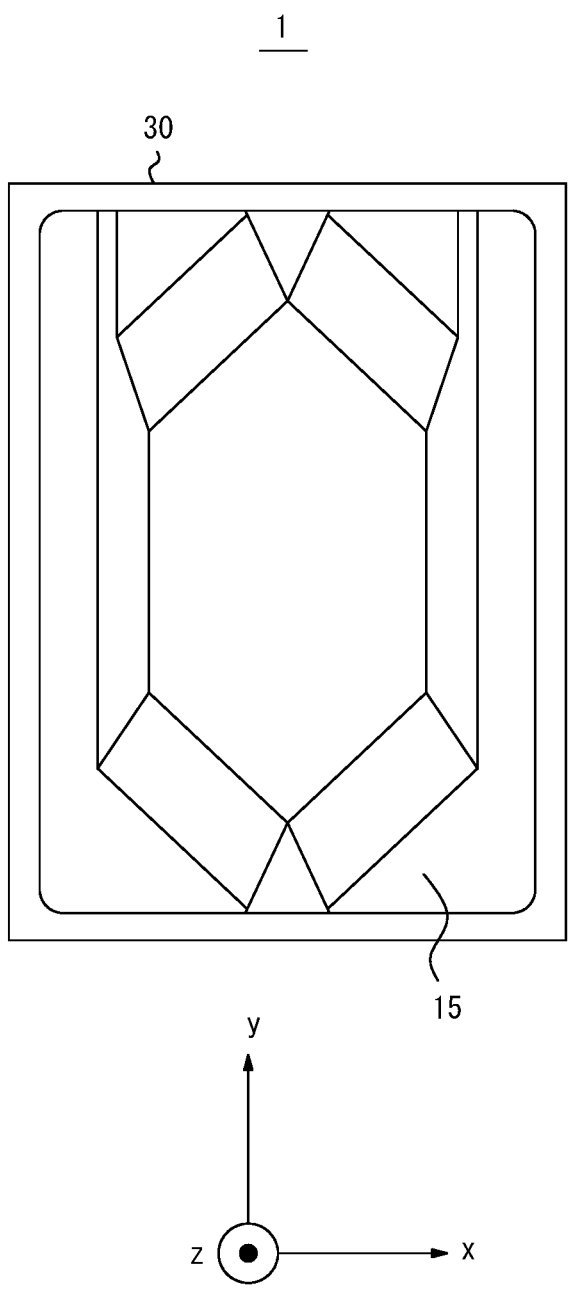
FIG. 4 is a plan view illustrating the upper surface of the gas sensor illustrated in FIG. 1.

FIG. 1 is a schematic view illustrating a configuration example of a gas sensor 1 according to the present embodiment. In FIG. 1, a substrate is illustrated transparently in order to illustrate positions of a light-emitting element 11, a light-receiving element 12, and so forth. FIG. 2 is a cross-sectional view illustrating a cross-section of the gas sensor 1 at an imaginary line b at the center of FIG. 1. FIG. 3 and FIG. 4 are plan views illustrating an upper surface of the gas sensor 1. FIG. 3 illustrates the gas sensor 1 with a light guide 15 thereof removed (i.e., transparent).

In FIGS. 1 to 4 and subsequently described FIGS. 8 and 9, Cartesian coordinates are set in correspondence with the orientation of the gas sensor 1. The z-axis direction is a height direction of the gas sensor 1. The y-axis direction corresponds to a vertical direction of the gas sensor 1 and corresponds to a longitudinal direction of a substrate having a rectangular shape in the present embodiment. The x-axis direction corresponds to a horizontal direction (width direction) of the gas sensor 1 and corresponds to a transverse direction of the substrate having a rectangular shape in the present embodiment. Note that the substrate may have a square shape, and, in this case, the x-axis direction and the y-axis direction may correspond to the direction of one side and a direction orthogonal thereto. Positional relationships are described below using these Cartesian coordinate axes.

As illustrated in FIGS. 1 to 4, the gas sensor 1 includes a substrate, a light-emitting element 11, a light-receiving element 12, and a plurality of external connection terminals 40. In the present embodiment, the gas sensor 1 further includes a light guide 15 that guides light emitted from the light-emitting element 11 to the light-receiving element 12 and a filter block 16a resin molded with an optical filter 16 at an emission surface of the light-emitting element 11. Moreover, in the present embodiment, the gas sensor 1 further includes an integrated circuit (IC) 13 that controls operation of the light-emitting element 11 and the light-receiving element 12 and that computes a concentration of a gas that is to be detected and a memory 14 that stores data, a program, or the like used by the IC 13. At least a portion of the plurality of external connection terminals 40 is electrically connected to the light-emitting element 11 and the light-receiving element 12. Moreover, a portion of the plurality of external connection terminals 40 may be connected to the IC 13 or the memory 14. Furthermore, either or both of the light-emitting element 11 and the light-receiving element 12 may be directly electrically connected to the IC 13. Also, the memory 14 may be omitted in a case in which a memory 14 can be provided in the IC 13. It is not essential that the gas sensor 1 includes the IC 13 in a case in which an IC 13 is provided externally. It is also not essential that the gas sensor 1 includes the memory 14 in a case in which a memory 14 is provided externally.

In a device having a semiconductor element sealed by resin, a package structure such as a fan out wafer level package (FOWLP) or a wafer level chip size package (WLCSP) may be adopted for the purpose of device miniaturization. In the present embodiment, the light-emitting element 11, the light-receiving element 12, the IC 13, and the memory 14 are semiconductor elements, and the gas sensor 1 embodies a small detection device having an FOWLP package structure. The substrate is used to mount and electrically connect these semiconductor elements. In the present embodiment, the substrate includes a redistribution layer 30 that is formed at an electrode formation surface side of the light-emitting element 11 and the light-receiving element 12. The redistribution layer 30 is described in detail further below. In the following description, one surface of the substrate (redistribution layer 30) that is a surface where the semiconductor elements are provided is referred to as a front surface 30a. An opposite surface of the substrate to the front surface 30a that is a surface where the plurality of external connection terminals 40 is provided is referred to as a rear surface 30b. The package structure of the gas sensor 1 is not limited to an FOWLP and may be another type of package structure such as a WLCSP or a small outline non-leaded package (SON), for example. The light-emitting element 11, the light-receiving element 12, and the like also individually include a substrate that is a constituent of the element. A substrate of an element is referred to herein as a semiconductor substrate 111 (refer to FIG. 5). Moreover, a product in which the gas sensor 1 is used as a component also includes a substrate. A substrate of a product is referred to herein as a product substrate. Note that the phrase "at the rear surface 30b" as used herein is inclusive not only of a state present directly on the rear surface 30b but also of a state present indirectly on the rear surface 30b. For example, the plurality of external connection terminals 40 may be provided at the rear surface 30b with another layer or the like in-between, and indirect placement in this manner is also referred to as "at the rear surface 30b".

The light-emitting element 11 is provided at the front surface 30a of the substrate or embedded in the substrate and emits light used to detect a gas that is to be detected. No specific limitations are placed on the light-emitting element 11 so long as it outputs light including a wavelength that is absorbed by the gas that is to be detected. The light emitted by the light-emitting element 11 is infrared light in the present embodiment, but is not limited to infrared light. The light-emitting element 11 is an LED in the present embodiment, but other examples thereof include a semiconductor laser, a microelectromechanical systems (MEMS) heater, and the like. The phrase "provided at the front surface 30a" as used herein is inclusive not only of provision directly on the front surface 30a but also of provision indirectly on the front surface 30a. For example, the light-emitting element 11 may be provided at the front surface 30a of the substrate with a conductive adhesive, another layer, or the like in-between, and indirect placement in this manner is also referred to as "provided at the front surface 30a".

The wavelength of the infrared light may be 2 μm to 12 μm. The region of 2 μm to 12 μm is a wavelength band that is particularly suitable for use in the gas sensor 1 due to a large number of absorption bands that are characteristic of various gases being present in this region. For example, an absorption band for methane is present at a wavelength of 3.3 μm, an absorption band for carbon dioxide is present at a wavelength of 4.3 μm, and an absorption band for alcohol (ethanol) is present at a wavelength of 9.5 μm.

The light-receiving element 12 is provided at the front surface 30a of the substrate or embedded in the substrate and receives light emitted from the light-emitting element 11. No specific limitations are placed on the light-receiving element 12 so long as it has sensitivity to a band of light including a wavelength that is absorbed by the gas that is to be detected. The light received by the light-receiving element 12 in the present embodiment is infrared light, but is not limited to infrared light. The light-receiving element 12 converts received light to an electrical signal and outputs the converted electrical signal. The electrical signal is output to the IC 13, for example. The IC 13 that receives the electrical signal computes a concentration of the gas that is to be detected based on the transmittance of light, for example.

As illustrated in FIG. 2, the light-emitting element 11 and the light-receiving element 12 may be embedded in the substrate. A surface opposite to the electrode formation surface of the light-emitting element 11 and the light-receiving element 12 is exposed from the substrate. Embedding in the substrate enables thickness reduction of the gas sensor 1. In general, the light-emitting element 11 and the light-receiving element 12 are directly subjected to an effect of warping of the substrate in a case in which they are embedded in the substrate. However, the configuration of the gas sensor 1 according to the present embodiment can suppress characteristic variation of the light-emitting element 11 and the light-receiving element 12 caused by deformation as described further below. Note that not only the light-emitting element 11 and the light-receiving element 12, but also the IC 13 and the memory 14 may be embedded in the substrate as illustrated in FIG. 2.

The light guide 15 is a member that guides light emitted from the light-emitting element 11 to the light-receiving element 12. The light guide 15 is an optical system of the gas sensor 1. The light guide 15 includes an optical member and constitutes a light path from the light-emitting element 11 to the light-receiving element 12. The optical member may be a mirror, a lens, or the like, for example. In the present embodiment, the light guide 15 is adhered to the substrate at an adhesion surface 17 of the front surface 30a of the substrate and forms a space into which a gas is introduced. Light emitted from the light-emitting element 11 is caused to pass through the gas in the space and be received by the light-receiving element 12 through the light guide 15. In a situation in which the gas that is to be detected is included in the gas in the space, light of a particular wavelength is absorbed in accordance with the concentration, thereby enabling measurement of the concentration of the gas that is to be detected through detection of the amount of absorption.

The optical filter 16 is a member having a wavelength selection function. The optical filter 16 may be a bandpass filter that transmits light in an absorption wavelength band of the gas that is to be detected. The optical filter 16 is provided at an emission surface of the light-emitting element 11 in the present embodiment, but is not limited thereto. For example, the optical filter 16 may be provided at a reception surface (irradiation surface) of the light-receiving element 12.

Figure 5:
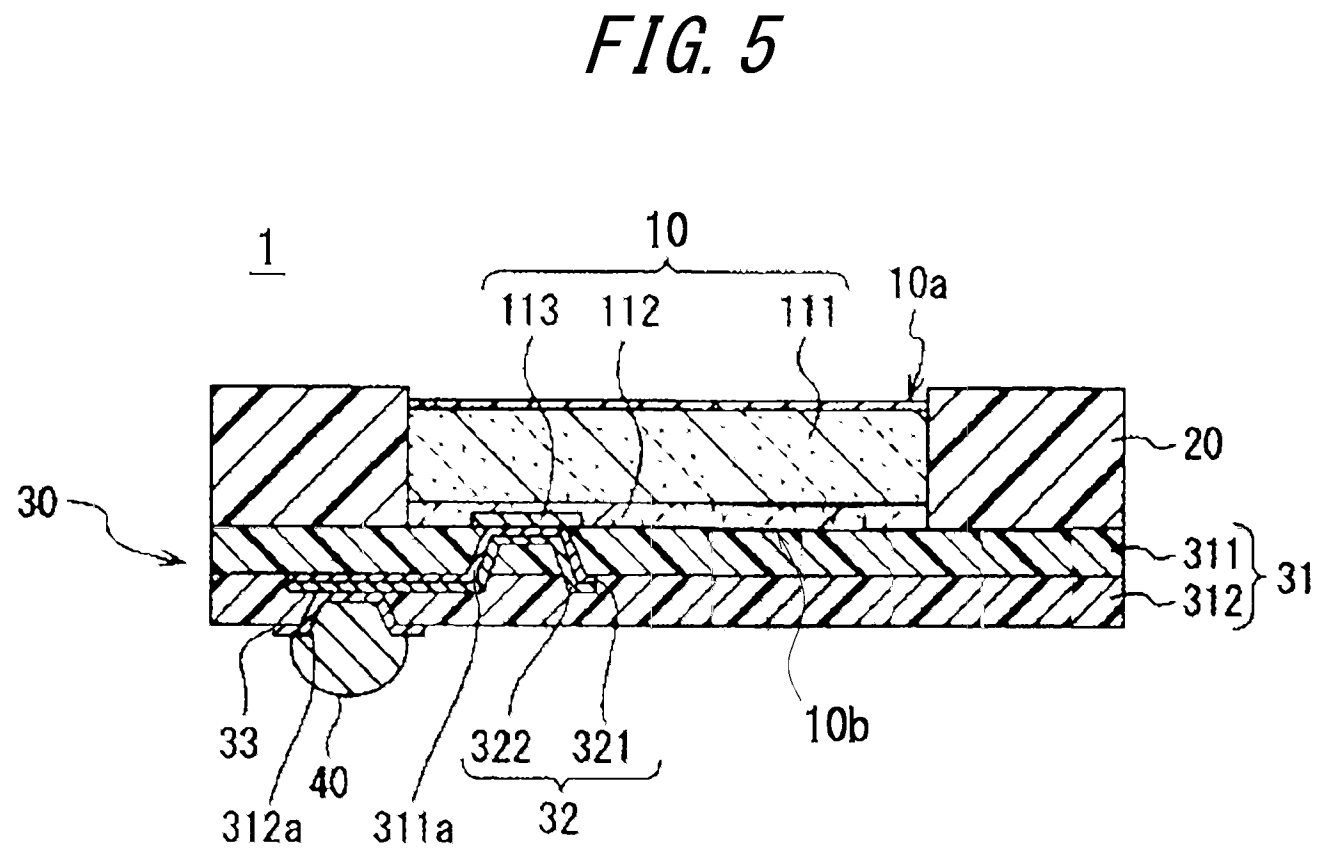

FIG. 5 is a cross-sectional view illustrating a partially enlarged cross-section that includes a photoelectric conversion element 10 of the gas sensor 1 illustrated in FIG. 1. The photoelectric conversion element 10 is the light-emitting element 11 or the light-receiving element 12. Terms for the photoelectric conversion element 10 may be used when describing structures that are common to both the light-emitting element 11 and the light-receiving element 12. The enlarged cross-section illustrated in FIG. 5 may be a cross-section at an imaginary line a that cuts across the light-emitting element 11 and an external connection terminal 40 in FIG. 1, for example.

As illustrated in FIG. 5, an electrode 113 is provided at a surface at an opposite side to a light emission/irradiation surface 10a of the photoelectric conversion element 10. An electrode formation surface 10b, which is the surface of the photoelectric conversion element 10 where the electrode 113 is formed, is in contact with the redistribution layer 30. The photoelectric conversion element 10 is electrically connected to the redistribution layer 30 via the electrode 113.

The semiconductor substrate 111 is an element substrate on which it is possible to form a semiconductor layer 112 having a PN junction or PIN junction photodiode structure. No specific limitations are placed on the semiconductor substrate 111 so long as it displays light transmittance of infrared light or the like. The semiconductor substrate 111 may include a material that contains a semiconductor or may be electrically insulating. The semiconductor substrate 111 may, for example, be formed of silicon (Si), gallium arsenide (GaAs), sapphire, indium phosphide (InP), or the like. In a case in which the semiconductor layer 112 is formed of a material containing a narrow gap semiconductor material including In, Sb, As, Al, or the like (for example, InSb), it is preferable to use a GaAs substrate as the semiconductor substrate 111 from a viewpoint of forming a semiconductor layer 112 with few lattice defects. In this case, the semiconductor substrate 111 displays high transmittance of light and enables high-quality crystalline growth thereon. In addition, irregularities may be formed or an antireflection film of $TiO_2$ or the like may be formed at the surface 10a of the semiconductor substrate 111. This makes it possible to improve light extraction.

The semiconductor layer 112 may, for example, have a PIN junction photodiode structure that includes a first conductivity type semiconductor layer, an active layer, and a second conductivity type semiconductor layer. The semiconductor layer 112 is not limited to a particular structure so long as it has a PIN junction or PN junction photodiode structure or LED structure. A commonly known substance having sensitivity to light of a particular wavelength such as infrared light can be adopted in the semiconductor layer 112. For example, InSb can be adopted. The electrode 113 is formed on the semiconductor layer 112.

A seal 20 that is formed of a resin material covers a side surface of the photoelectric conversion element 10 in a manner such that the light emission/irradiation surface 10a of the photoelectric conversion element 10 is exposed. In addition, the electrode formation surface 10b of the photoelectric conversion element 10 is exposed to the redistribution layer 30. In other words, in the gas sensor 1 according to the present embodiment, the photoelectric conversion element 10 is sealed by the seal 20 with the exception of the light emission/irradiation surface 10a and the electrode formation surface 10b thereof. No specific limitations are placed on the surface covered by the seal 20 so long as the seal 20 is formed in a manner such that light (infrared light, etc.) can be emitted from or irradiate the semiconductor layer 112 via the semiconductor substrate 111. For example, the seal 20 may cover part of the electrode formation surface 10b of the photoelectric conversion element 10 or may not cover part of the side surface of the photoelectric conversion element 10. An upper surface of a part of the seal 20 that covers the side surface of the photoelectric conversion element 10 may be thinner than the light emission/irradiation surface 10a or may be flush with the light emission/irradiation surface 10a.

From a viewpoint of mass producibility, mechanical strength, and stress on the photoelectric conversion element 10, it is preferable that a resin material having a similar linear expansion coefficient to the redistribution layer 30 is used as the seal 20. For example, the seal 20 may be formed of a resin material such as epoxy resin.

Besides a resin material such as epoxy resin, the material forming the seal 20 may contain a filler, impurities that are unavoidably mixed in, and so forth. Silica, alumina, or the like, for example, may suitably be used as the filler.

The redistribution layer 30 is formed at the electrode formation surface 10b side of the photoelectric conversion element 10 and the seal 20. The redistribution layer 30 includes an insulating layer 31 that includes a first insulating layer 311 and a second insulating layer 312, a redistribution wire 32 electrically connected to the electrode 113 of the photoelectric conversion element 10, and a pad 33 for connection of the external connection terminal 40. In the present embodiment, the redistribution wire 32 is connected to the electrode 113, and the redistribution wire 32 is connected to the external connection terminal 40.

The first insulating layer 311 is formed at the electrode formation surface 10b side of the photoelectric conversion element 10 and the seal 20. The first insulating layer 311 is formed of a material having little warping, excellent cohesion with the redistribution wire 32, and high heat resistance. Specifically, the first insulating layer 311 is formed of a resin material such as polyimide. The first insulating layer 311 has an opening 311a that penetrates through the first insulating layer 311 at a position of the electrode 113 of the photoelectric conversion element 10. The redistribution wire 32 can be electrically connected to the electrode 113 via the opening 311a.

The redistribution wire 32 is provided between the first insulating layer 311 and the second insulating layer 312. The redistribution wire 32 covers a front surface of the electrode 113 that is exposed from the opening 311a in the first insulating layer 311 and also covers a side wall of the opening 311a. The redistribution wire 32 extends along a front surface of the first insulating layer 311 from the side wall of the opening 311a to the pad 33.

The redistribution wire 32 includes a foundation layer 321 and a conductor layer 322. The foundation layer 321 is formed by electroless plating or sputtering, for example. Moreover, the foundation layer 321 fulfills a role of improving adhesiveness between the first insulating layer 311 and the conductor layer 322. The foundation layer 321 may be formed of copper (Cu), for example. The conductor layer 322 is formed on the foundation layer 321 and may be formed by electrolytic plating, for example. The conductor layer 322 is formed of copper (Cu), for example.

The second insulating layer 312 is an insulating layer that is formed at the front surface of the first insulating layer 311. The second insulating layer 312 is formed of a resin material such as polyimide, for example, in the same manner as the first insulating layer 311. The second insulating layer 312 has an opening 312a that penetrates through the second insulating layer 312 in a region that does not overlap with the opening 311a in the first insulating layer 311 in plan view. The pad 33 can be electrically connected to the redistribution wire 32 via the opening 312a.

The pad 33 is provided in order to connect the external connection terminal 40 to the redistribution wire 32. The pad 33 is formed of a laminate film of a Ni layer and a Au layer, for example. The pad 33 covers the front surface of the redistribution wire 32 that is exposed from the opening 312a in the second insulating layer 312 and a side wall of the opening 312a.

The external connection terminal 40 is in contact with the pad 33 and is electrically connected to the redistribution wire 32 that is exposed from the opening 312a in the second insulating layer 312. In the present embodiment, the plurality of external connection terminals 40 is a ball grid array (BGA). The external connection terminal 40 may be a solder ball, for example. However, no limitations are placed on the shape, etc. of the external connection terminal 40. The plurality of external connection terminals 40 may alternatively be a land grid array (LGA), for example.

In a situation in which the gas sensor 1 is mounted on a product substrate to be used as a component of a product such as a measurement instrument, for example, the plurality of external connection terminals 40 is soldered by reflow at a specific position on the product substrate.

Figure 6:
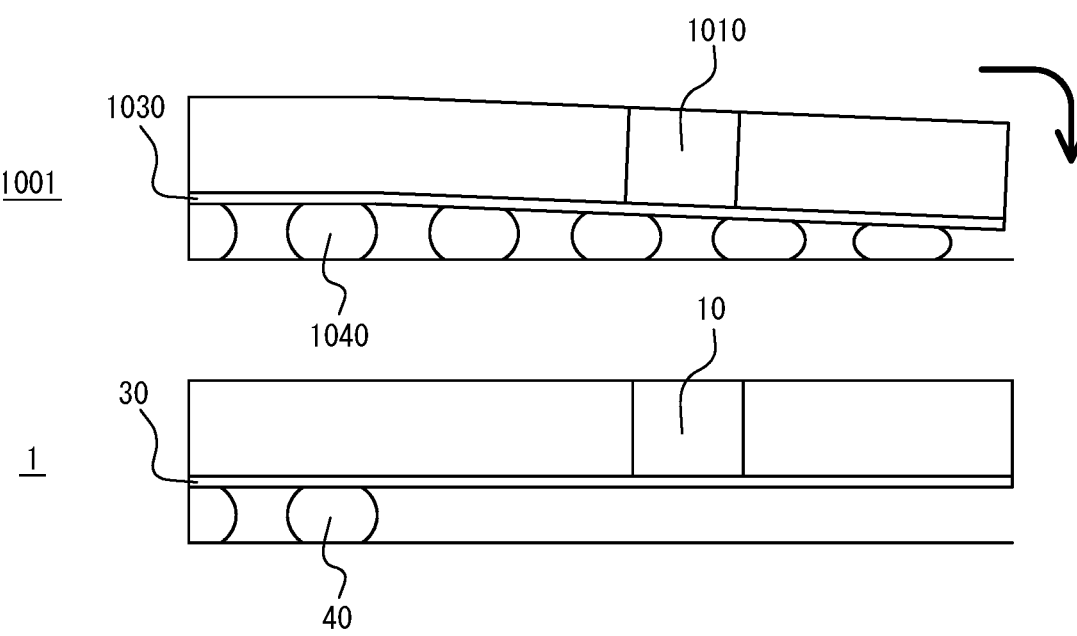
FIG. 6 is a diagram for describing stress in a case in which external connection terminals are a ball grid array (BGA)

Conventionally, there have been instances in which force acts on a substrate of an optical device under the influence of thermal expansion caused by reflow during mounting of the optical device or contraction caused by subsequent cooling, thereby resulting in deformation of an optical element and characteristic variation of the optical device. For example, as illustrated in the upper diagram in FIG. 6, in the case of a small gas sensor 1001 having a conventional structure in which external connection terminals 1040 are a BGA, the external connection terminals 1040 (solder balls) may melt while a substrate (redistribution layer 1030) is in a warped state due to reflow heat and may subsequently harden in a squashed state when the temperature drops. This may lead to deformation of a photoelectric conversion element 1010 and characteristic variation of the gas sensor 1001. Moreover, as illustrated in the upper diagram in FIG. 7, for example, in the case of a small gas sensor 1001 having a conventional structure in which external connection terminals 1040 are an LGA, the LGA package may contract when the temperature falls after reflow due to the LGA package having a larger linear expansion coefficient than a product substrate, thereby resulting in stress pulling toward the external connection terminals 1040 that are connected to the product substrate. This may lead to a photoelectric conversion element 1010 being deformed by pulling toward a plurality of external connection terminals 1040 and characteristic variation of the gas sensor 1001.

In the gas sensor 1 according to the present embodiment, the plurality of external connection terminals 40 is arranged in a region that is in one direction relative to a photoelectric conversion element 10 in plan view. For example, as illustrated in FIG. 1, the plurality of external connection terminals 40 is in a region c that is positioned in one direction (negative y-axis direction) relative to the light-emitting element 11 in plan view. The region c where the plurality of external connection terminals 40 is arranged may be defined as a range encompassed by outermost external connection terminals 40 among the plurality of external connection terminals 40. Moreover, the plurality of external connection terminals 40 is in the region c that is positioned in one direction (positive y-axis direction) relative to the light-receiving element 12 in plan view. Through photoelectric conversion elements 10 and external connection terminals 40 having a positional relationship such as set forth above, hardening with the substrate (redistribution layer 30) in a warped state during reflow does not occur in the gas sensor 1 according to the present embodiment as illustrated in the lower diagram in FIG. 6. For this reason, the gas sensor 1 according to the present embodiment can suppress characteristic variation caused by deformation of a semiconductor substrate 111.

Figure 7:
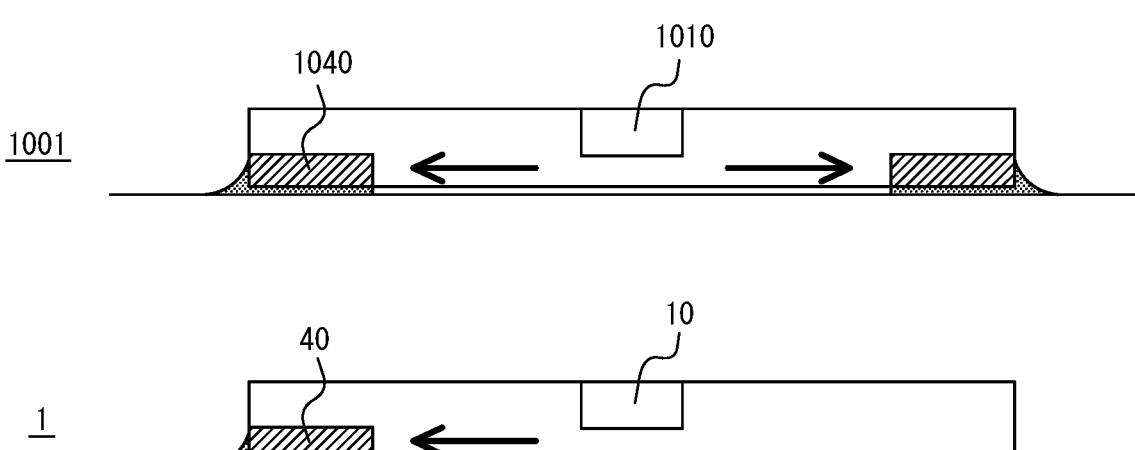
FIG. 7 is a diagram for describing stress in a case in which external connection terminals are a land grid array (LGA)

Moreover, in a case in which the external connection terminals 40 are an LGA, pulling toward a plurality of external connection terminals 40 during reflow does not occur in the gas sensor 1 according to the present embodiment as illustrated in the lower diagram in FIG. 7. For this reason, characteristic variation caused by deformation of a semiconductor substrate 111 can be suppressed.

In the gas sensor 1, the plurality of external connection terminals 40 should be substantially arranged in a region that is in one direction relative to a photoelectric conversion element 10. More specifically, the plurality of external connection terminals 40 should be arranged such that the light-emitting element 11 and the light-receiving element 12 are not present on a line linking any two external connection terminals 40 in plan view.

Figure 8:
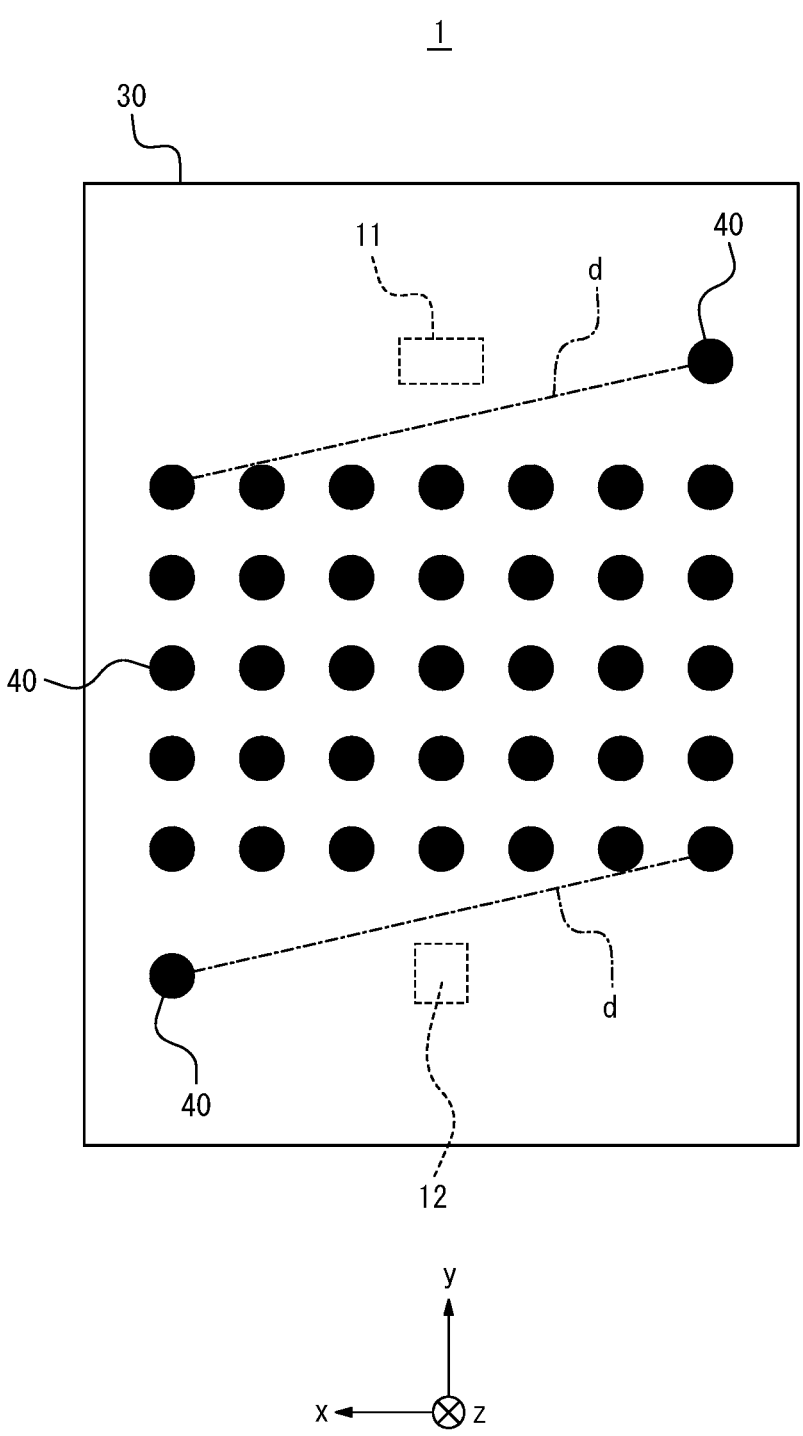
FIG. 8 is a schematic view illustrating another arrangement example of external connection terminals.
Figure 9:
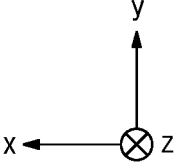
FIG. 9 is a schematic view illustrating another arrangement example of external connection terminals.

FIG. 8 is a diagram illustrating an example of a state in which the plurality of external connection terminals 40 is substantially arranged in a region that is in one direction relative to a photoelectric conversion element 10. Compared to FIG. 1, an external connection terminal 40 is also arranged in a negative x-axis direction from the light-emitting element 11 and an external connection terminal 40 is also arranged in a positive x-axis direction from the light-receiving element 12. In other words, the plurality of external connection terminals 40 is positioned in the negative y-axis direction and the negative x-axis direction relative to the light-emitting element 11 in plan view. Moreover, the plurality of external connection terminals 40 is positioned in the positive y-axis direction and the positive x-axis direction relative to the light-receiving element 12 in plan view. However, the light-emitting element 11 and the light-receiving element 12 are not present on a line linking any two external connection terminals 40 among the plurality of external connection terminals 40. Imaginary lines d in FIG. 8 are examples of lines linking two external connection terminals 40 such as described above. Accordingly, even when the plurality of external connection terminals 40 is arranged as illustrated in FIG. 8, hardening thereof does not occur in a state in which a substrate (redistribution layer 1030) is warped with a photoelectric conversion element 1010 sandwiched in-between as illustrated in the upper diagram in FIG. 6. Moreover, force pulling in opposite directions sandwiching a photoelectric conversion element 1010 as illustrated in the upper diagram in FIG. 7 does not arise. For this reason, characteristic variation caused by deformation of a semiconductor substrate 111 can be suppressed in the gas sensor 1 as a result of the plurality of external connection terminals 40 being arranged such that the light-emitting element 11 and the light-receiving element 12 are not present on a line linking any two external connection terminals 40.

Furthermore, although the light-emitting element 11 and the light-receiving element 12 are arranged such as to sandwich the plurality of external connection terminals 40 in plan view in the examples illustrated in FIG. 1 and FIG. 8, the light-emitting element 11 and the light-receiving element 12 are not limited to such a positional relationship. For example, the light-emitting element 11 and the light-receiving element 12 may be lined up and arranged in one direction (positive y-axis direction as one example) relative to the plurality of external connection terminals 40 in plan view as illustrated in FIG. 9. In this case, the region c where the plurality of external connection terminals 40 is arranged can be enlarged. Moreover, although the light-emitting element 11 and the light-receiving element 12 are arranged with the same orientation (such that sides thereof are parallel) in plan view in the examples illustrated in FIG. 1 and FIG. 8, one of the light-emitting element 11 and the light-receiving element 12 may be arranged at an angle (i.e., be rotated) relative to the other thereof. This angle is not specifically limited but, as one example, may be 45°.

In a case in which the gas sensor 1 includes a light guide 15 that is adhered to the substrate, force may act on the substrate as a result of contraction of an adhesive, for example. For this reason, it is preferable that the adhesion surface 17 is provided such that the light-emitting element 11 and the light-receiving element 12 are not present on a line linking any two points in the adhesion surface 17 in plan view. In particular, it is preferable that the adhesion surface 17 is included in a region of the front surface 30a that corresponds to the region c where the plurality of external connection terminals 40 is arranged at the rear surface 30b as illustrated in FIG. 3. Limiting the adhesion surface 17 in this manner can further enhance the effect of suppressing characteristic variation caused by deformation of a semiconductor substrate 111.

In this manner, the gas sensor 1 according to the present embodiment can suppress characteristic variation caused by deformation of a semiconductor substrate 111 as compared to a conventional structure through the configuration set forth above.

Although an embodiment of the present disclosure has been described based on the various drawings and examples, it should be noted that a person of ordinary skill in the art could easily make various modifications and revisions based on the present disclosure. Accordingly, such modifications and revisions should also be considered to be included within the scope of the present disclosure. For example, functions and the like included in various constituent parts, etc., may be rearranged so long as they are logically consistent. Moreover, a plurality of constituent parts, etc., may be combined as a single part or may be split up.

The invention claimed is:

1. A gas sensor comprising:
   a substrate;
   a light-emitting element provided at a front surface that is one surface of the substrate or embedded in the substrate;
   a light-receiving element that is provided at the front surface of the substrate or embedded in the substrate and that receives light emitted from the light-emitting element; and
   a plurality of external connection terminals at a rear surface that is an opposite surface to the front surface of the substrate, with at least a portion of the plurality of external connection terminals electrically connected to the light-emitting element and the light-receiving element, wherein the plurality of external connection terminals is arranged such that, in plan view, the light-emitting element and the light-receiving element are not present on a line linking any two external connection terminals, the center of gravity of the substrate is located, in plan view, within a region in which the plurality of external connection terminals is arranged.

2. The gas sensor according to claim 1, wherein the plurality of external connection terminals is arranged in a region that is in one direction relative to each of the light-emitting element and the light-receiving element in plan view.

3. The gas sensor according to claim 1, wherein the light-emitting element and the light-receiving element are partially covered by a seal.

4. The gas sensor according to claim 1, wherein the substrate includes a redistribution layer formed at an electrode formation surface side of the light-emitting element and the light-receiving element, and the light-emitting element and the light-receiving element are electrically connected to at least a portion of the plurality of external connection terminals via the redistribution layer.

5. The gas sensor according to claim 1, further comprising an optical filter provided at an emission surface of the light-emitting element or a reception surface of the light-receiving element.

6. The gas sensor according to claim 1, wherein the plurality of external connection terminals is an LGA or a BGA.

7. The gas sensor according to claim 1, wherein the light-emitting element and the light-receiving element are embedded in the substrate, and a surface opposite to an electrode formation surface of the light-emitting element and the light-receiving element is exposed from the substrate.

8. A gas sensor comprising:

a substrate;

a light-emitting element provided at a front surface that is one surface of the substrate or embedded in the substrate;

a light-receiving element that is provided at the front surface of the substrate or embedded in the substrate and that receives light emitted from the light-emitting element;

a light guide that guides light emitted from the light-emitting element to the light-receiving element, and a plurality of external connection terminals at a rear surface that is an opposite surface to the front surface of the substrate, with at least a portion of the plurality of external connection terminals electrically connected to the light-emitting element and the light-receiving element, wherein the plurality of external connection terminals is arranged such that, in plan view, the light-emitting element and the light-receiving element are not present on a line linking any two external connection terminals, and the light guide is adhered to the substrate at an adhesion surface of the front surface of the substrate, and the adhesion surface is provided such that, in plan view, the light-emitting element and the light-receiving element are not present on a line linking any two points in the adhesion surface.

9. The gas sensor according to claim 8, wherein the adhesion surface is included in a region of the front surface that corresponds to a region where the plurality of external connection terminals is arranged at the rear surface.

10. A gas sensor comprising:

a substrate;

a light-emitting element provided at a front surface that is one surface of the substrate or embedded in the substrate;

a light-receiving element that is provided at the front surface of the substrate or embedded in the substrate and that receives light emitted from the light-emitting element; and a plurality of external connection terminals at a rear surface that is an opposite surface to the front surface of the substrate, with at least a portion of the plurality of external connection terminals electrically connected to the light-emitting element and the light-receiving element, wherein the plurality of external connection terminals is arranged such that, in plan view, the light-emitting element and the light-receiving element are not present on a line linking any two external connection terminals, an integrated circuit that computes a concentration of a gas is located, in plan view, within a region in which the plurality of external connection terminals is arranged.

* * * * *